(12) United States Patent
Liao et al.

(10) Patent No.: US 11,742,456 B2
(45) Date of Patent: Aug. 29, 2023

(54) CHIP-DETECTING METHOD, CHIP-DETECTING STRUCTURE AND CHIP-CARRYING STRUCTURE

(71) Applicant: ASTI GLOBAL INC., TAIWAN, Taichung (TW)

(72) Inventors: Chien-Shou Liao, New Taipei (TW); Cheng-Chieh Chang, Taoyuan (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 227 days.

(21) Appl. No.: 17/341,392

(22) Filed: Jun. 8, 2021

(65) Prior Publication Data

US 2021/0384376 A1 Dec. 9, 2021

Related U.S. Application Data

(60) Provisional application No. 63/036,501, filed on Jun. 9, 2020.

(51) Int. Cl.
*H01L 33/00* (2010.01)
*H01L 33/62* (2010.01)
*H01L 21/66* (2006.01)

(52) U.S. Cl.
CPC .......... *H01L 33/0095* (2013.01); *H01L 22/20* (2013.01); *H01L 33/62* (2013.01); *H01L 2933/0066* (2013.01)

(58) Field of Classification Search
CPC ..... H01L 33/0095; H01L 22/20; H01L 33/62; H01L 2933/0066; H01L 2224/81191; H01L 2224/95; H01L 24/00; H01L 21/67242; G01R 31/2884; G01R 1/0416; G01R 31/2887
See application file for complete search history.

(56) References Cited

U.S. PATENT DOCUMENTS

| | | | |
|---|---|---|---|
| 8,967,452 B2* | 3/2015 | Cheung | H01L 24/75 |
| | | | 228/230 |
| 2013/0210194 A1* | 8/2013 | Bibl | H01L 24/75 |
| | | | 438/107 |

* cited by examiner

*Primary Examiner* — Ratisha Mehta

(57) ABSTRACT

A chip-detecting method, a chip-detecting structure and a chip-carrying structure are provided. The chip-detecting method includes providing a chip-detecting structure including a plurality of micro heater groups, a chip-carrying structure for carrying a plurality of chips, and a plurality of soldering material groups disposed between the chip-carrying structure and the chip-detecting structure; placing the chip-carrying structure and the chip-detecting structure adjacent to each other, so that each of the soldering material groups simultaneously contact the chip-carrying structure and the chip-detecting structure; respectively curing the low-temperature soldering material groups by heating of the micro heater groups, so that the chips are electrically connected to the chip-detecting structure respectively through the low-temperature soldering material groups that have been cured; and then detecting the chips so as to divide the chips into a plurality of good chips and a plurality of bad chips.

13 Claims, 12 Drawing Sheets

CHIP-DETECTING METHOD, CHIP-DETECTING STRUCTURE AND CHIP-CARRYING STRUCTURE

CROSS-REFERENCE TO RELATED PATENT APPLICATION

This application claims priority to the U.S. Provisional Patent Application Ser. No. 63/036,501 filed on Jun. 9, 2020, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a detecting method, a detecting structure and a carrying structure, and more particularly to a chip-detecting method, a chip-detecting structure and a chip-carrying structure.

BACKGROUND OF THE DISCLOSURE

In the related art, a plurality of light-emitting diode chips can be manufactured on the same wafer, but the light-emitting diode chips need to be cut from the wafer before optically detecting the light-emitting diode chips. Hence, not only it is difficult to optically detect the light-emitting diode chips, but also the detection efficiency of light-emitting diode chips is reduced.

SUMMARY OF THE DISCLOSURE

In response to the above-referenced technical inadequacy, the present disclosure provides a chip-detecting method, a chip-detecting structure and a chip-carrying structure.

In one aspect, the present disclosure provides a chip-detecting method including: providing a chip-detecting structure, a chip-carrying structure, and a plurality of soldering material groups, in which the chip-detecting structure includes a plurality of micro heater groups, the chip-carrying structure is used for carrying a plurality of chips, and the soldering material groups are disposed between the chip-carrying structure and the chip-detecting structure; placing the chip-carrying structure and the chip-detecting structure adjacent to each other, so that each of the soldering material groups simultaneously contact the chip-carrying structure and the chip-detecting structure, in which each of the soldering material groups includes a low-temperature soldering material group and a high-temperature soldering material group that has a melting point higher than a melting point of the low-temperature soldering material group; respectively curing the low-temperature soldering material groups by heating of the micro heater groups, so that the chips are electrically connected to the chip-detecting structure respectively through the low-temperature soldering material groups that have been cured; and then detecting the chips so as to divide the chips into a plurality of good chips and a plurality of bad chips.

In another aspect, the present disclosure provides a chip-detecting structure including a chip-detecting substrate and a plurality of micro heater groups. The chip-detecting substrate includes a plurality of substrate pad groups. The micro heater groups are disposed on the chip-detecting substrate or inside the chip-detecting substrate. The substrate pad groups of the chip-detecting substrate are respectively used for carrying a plurality of low-temperature soldering material groups.

In yet another aspect, the present disclosure provides a chip-carrying structure including a chip-carrying substrate for carrying a plurality of chips. The chips are respectively used for carrying a plurality of soldering material groups, and each of the soldering material groups includes a high-temperature soldering material group disposed on a corresponding one of the chips, and a low-temperature soldering material group disposed on the high-temperature soldering material group.

Therefore, by virtue of "placing the chip-carrying structure and the chip-detecting structure adjacent to each other, so that each of the soldering material groups simultaneously contact the chip-carrying structure and the chip-detecting structure, each of the soldering material groups including a low-temperature soldering material group and a high-temperature soldering material group that has a melting point higher than a melting point of the low-temperature soldering material group", "respectively curing the low-temperature soldering material groups by heating of the micro heater groups, so that the chips are electrically connected to the chip-detecting structure respectively through the low-temperature soldering material groups that have been cured" and "detecting the chips so as to divide the chips into a plurality of good chips and a plurality of bad chips", before the chips are bonded on a circuit substrate, the good chips can be selected from the chips in advance by detecting of the chip-detecting structure so as to ensure that only the good chips can be bonded on the circuit substrate during a chip-bonding process.

Moreover, by virtue of "the chip-detecting substrate including a plurality of substrate pad groups", "the micro heater groups being disposed on the chip-detecting substrate or inside the chip-detecting substrate" and "the substrate pad groups of the chip-detecting substrate being respectively used for carrying a plurality of low-temperature soldering material groups", each of the chips can be electrically connected to the chip-detecting substrate through the low-temperature soldering material group. Whereby, before the chips are bonded on a circuit substrate, the good chips can be selected from the chips in advance by detecting of the chip-detecting structure so as to ensure that only the good chips can be bonded on the circuit substrate during a chip-bonding process.

Furthermore, by virtue of "the chip-carrying substrate being used for carrying a plurality of chips" and "each of the soldering material groups including a high-temperature soldering material group disposed on a corresponding one of the chips, and a low-temperature soldering material group disposed on the high-temperature soldering material group", each of the chips can be electrically connected to the chip-detecting substrate through the low-temperature soldering material group. Whereby, before the chips are bonded on a circuit substrate, the good chips can be selected from the chips in advance by detecting of the chip-detecting structure so as to ensure that only the good chips can be bonded on the circuit substrate during a chip-bonding process.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
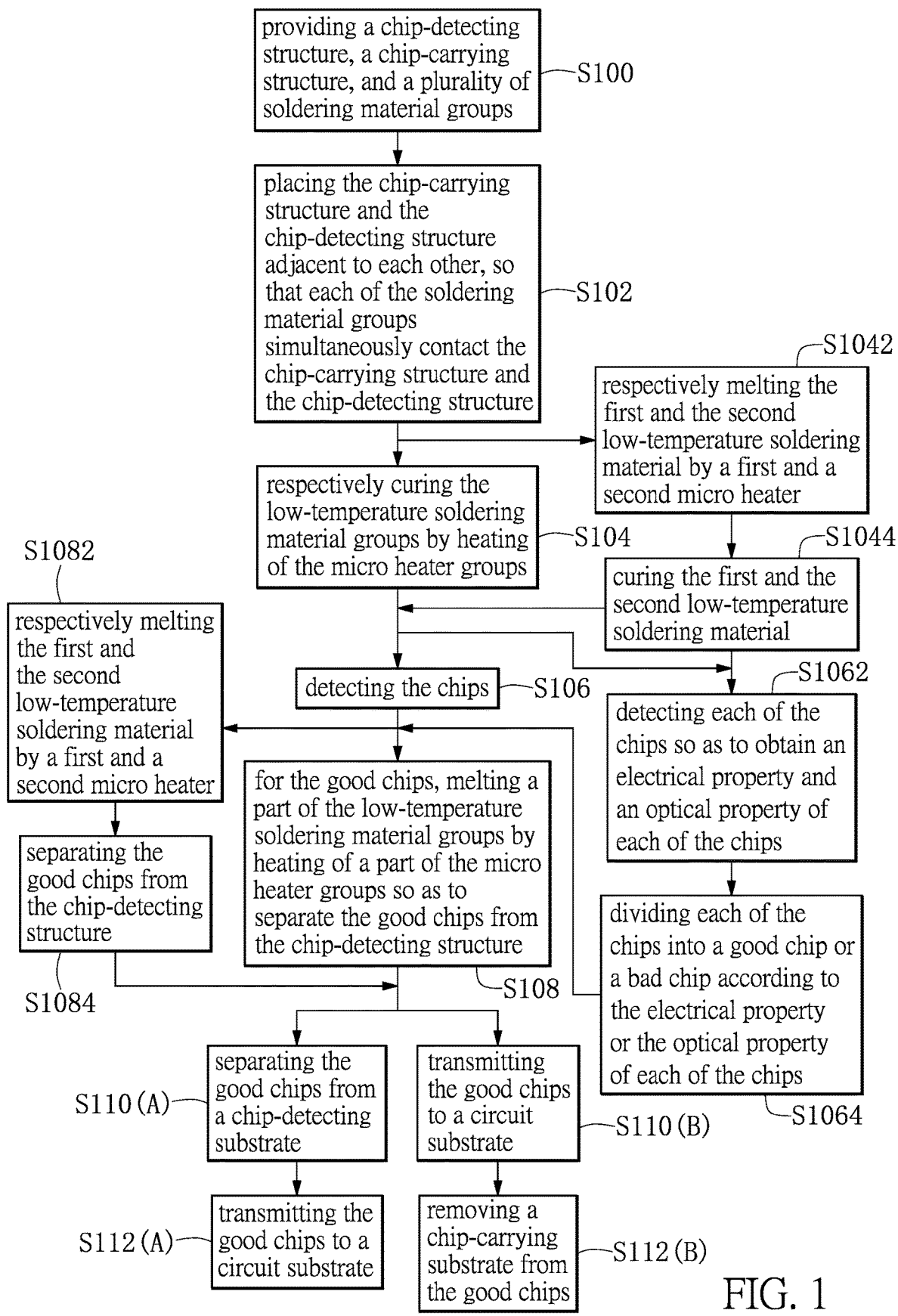
FIG. 1 is a flowchart of a chip-detecting method according to a first and a second embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
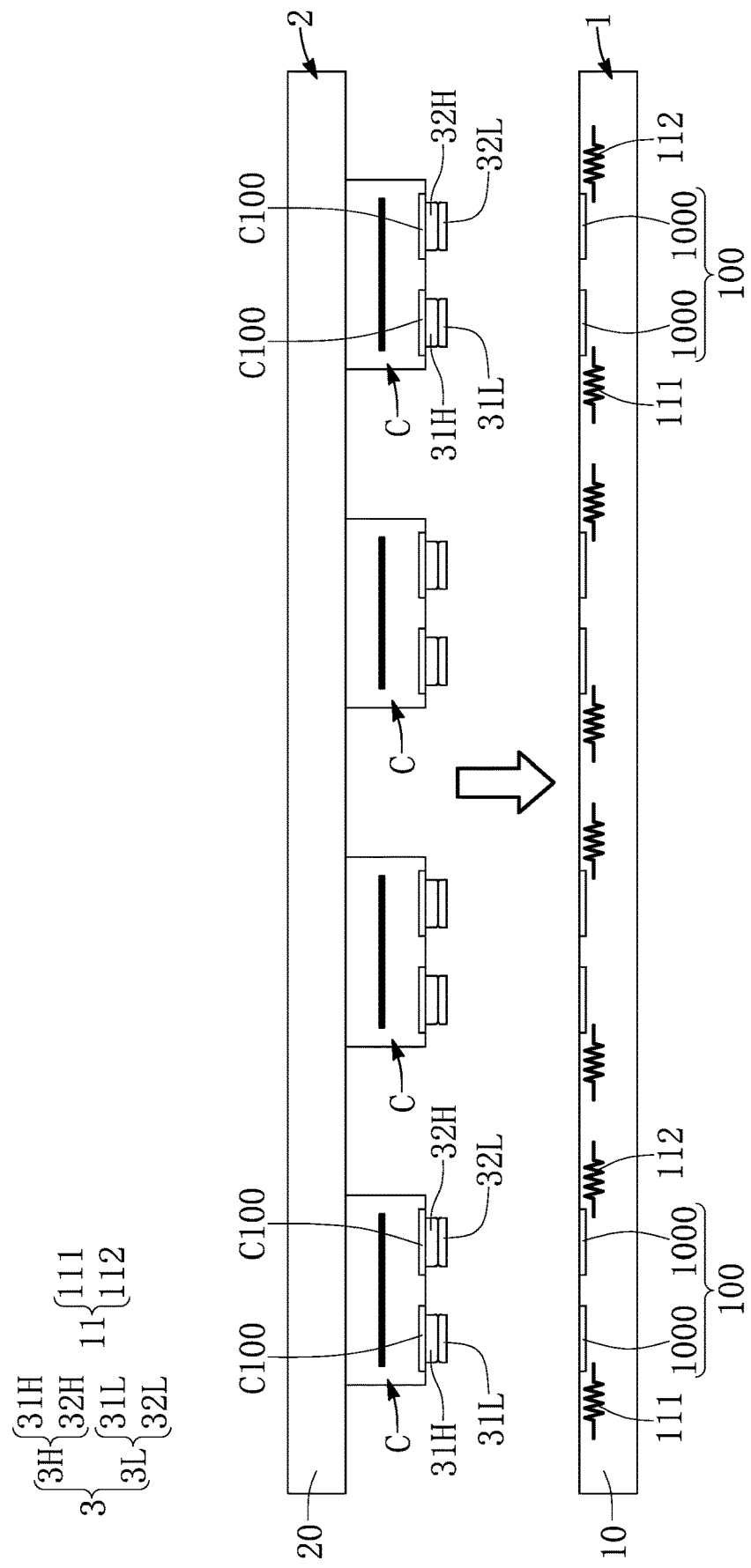
FIG. 2 is a schematic view of a plurality of low-temperature soldering material groups of a plurality of soldering material groups being respectively disposed on a plurality of chips of a chip-carrying structure according to the present disclosure.
Figure 3:
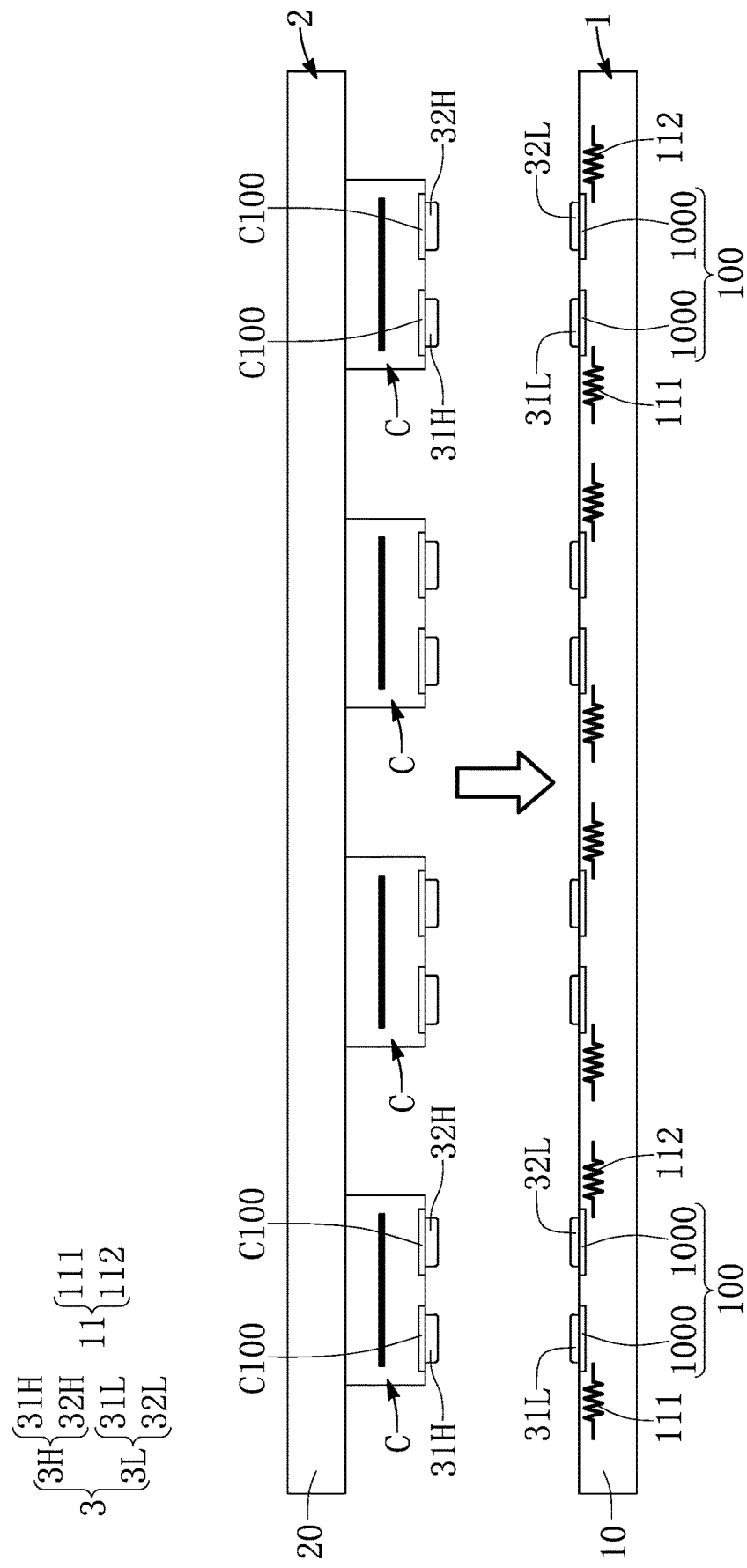
FIG. 3 is a schematic view of the low-temperature soldering material groups of the soldering material groups being respectively disposed on a plurality of substrate pad groups of a chip-detecting structure according to the present disclosure.
Figure 4:
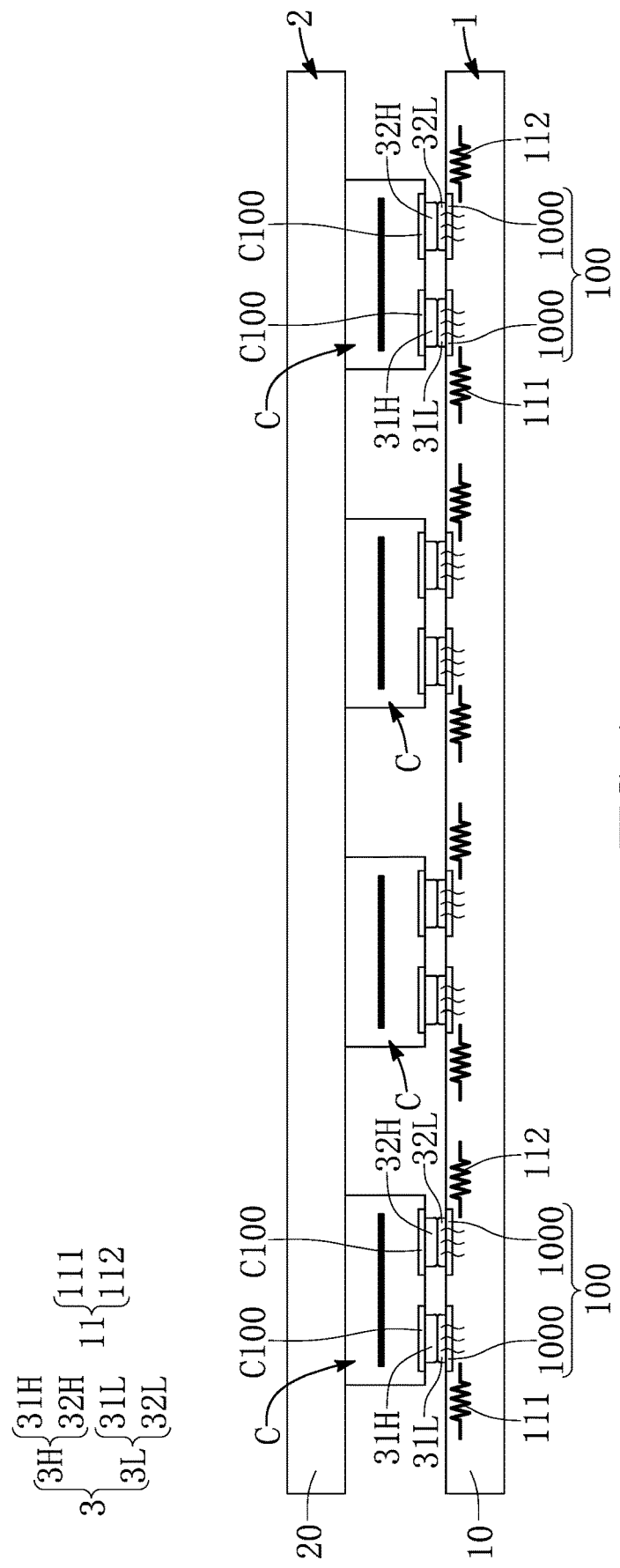
FIG. 4 is a schematic view of a first low-temperature soldering material and a second low-temperature soldering material of each of the low-temperature soldering material groups being respectively heated by a first micro heater and a second micro heater of a corresponding one of a plurality of micro heater groups according to the present disclosure.
Figure 5:
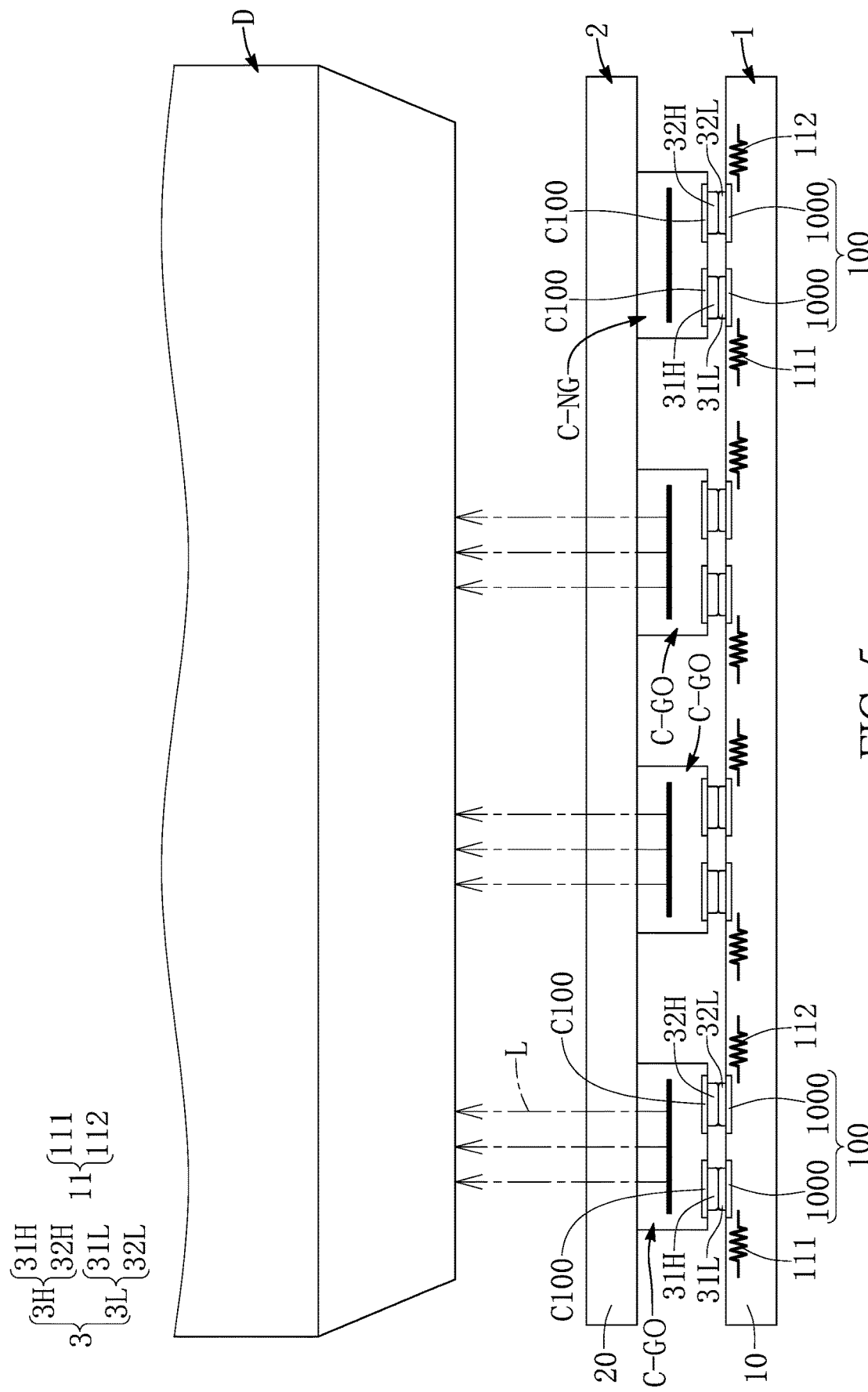
FIG. 5 is a schematic view of the chips being detected by an optical detection module according to the present disclosure.
Figure 6:
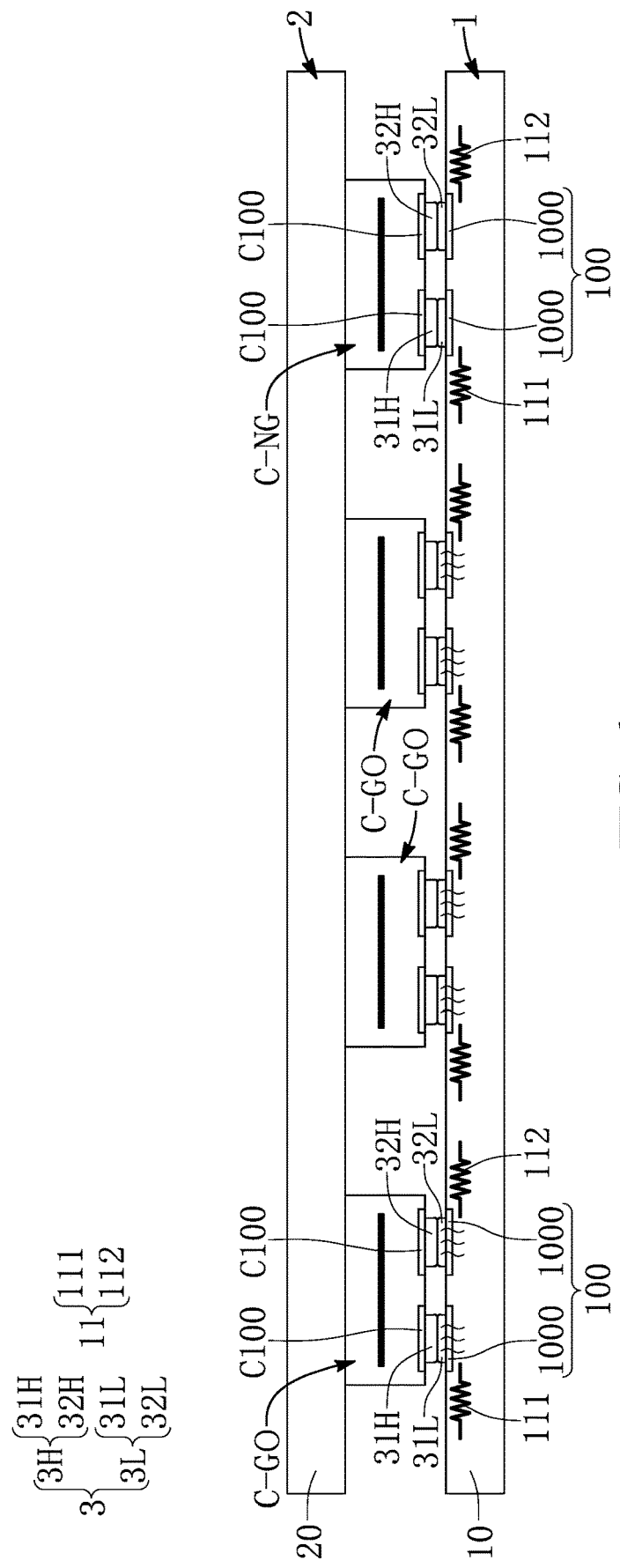
FIG. 6 is a schematic view of step S108 of the chip-detecting method according to the first embodiment of the present disclosure.

Referring to FIG. 1 to FIG. 11, a first embodiment of the present disclosure provides a chip-detecting method at least including the following steps: firstly, referring to FIG. 1 to FIG. 3, providing a chip-detecting structure 1, a chip-carrying structure 2, and a plurality of soldering material groups 3, the chip-detecting structure 1 includes a plurality of micro heater groups 11, the chip-carrying structure 2 being used for carrying a plurality of chips C, and the soldering material groups 3 are disposed between the chip-carrying structure 2 and the chip-detecting structure 1 (step S100); next, referring to FIG. 1 to FIG. 4, placing the chip-carrying structure 2 and the chip-detecting structure 1 adjacent to each other, so that each of the soldering material groups 3 simultaneously contact the chip-carrying structure 2 and the chip-detecting structure 1, each of the soldering material groups 3 including a low-temperature soldering material group 3L and a high-temperature soldering material group 3H that has a melting point higher than a melting point of the low-temperature soldering material group 3L (step S102); afterwards, referring to FIG. 1 and FIG. 4, respectively curing (such as heating, cooling and then solidifying) the low-temperature soldering material groups 3L by heating of the micro heater groups 11, so that the chips C are electrically connected to the chip-detecting structure 1 respectively through the low-temperature soldering material groups 3L that have been cured (such as solidified) (step S104); and then referring to FIG. 1 and FIG. 5, detecting the chips C so as to divide the chips C into a plurality of good chips (C-GO) and a plurality of bad chips (C-NG) (FIG. 5 only shows one of the bad chips (C-NG)) (step S106), so that the chip-detecting method for the chips C is completed.

For example, referring to FIG. 2 and FIG. 3, in the step S100 of providing the chip-detecting structure 1, the chip-carrying structure 2, and the soldering material groups 3, the chip-detecting structure 1 and the chip-carrying structure 2 can be separated from each other, and the low-temperature soldering material groups 3L of the soldering material groups 3 can be respectively disposed on the chips C of the chip-carrying structure 2 (as shown in FIG. 2) or a plurality of substrate pad groups 100 of the chip-detecting structure 1 (as shown in FIG. 3). More particularly, each of the low-temperature soldering material groups 3L can include a first low-temperature soldering material 31L and a second low-temperature soldering material 32L, and the first low-temperature soldering material 31L and the second low-temperature soldering material 32L can be low-temperature solders or any solder materials that can be melted at a low temperature (that is to say, the first low-temperature soldering material 31L or the second low-temperature soldering material 32L can be a low temperature solder that has a low melting point). The low melting point can be an arbitrary positive (or non-positive) integer that can range from 10 to 40° C. (or from 5 to 30° C., or from 20 to 50° C.) or cannot exceed 178° C. In addition, each of the high-temperature soldering material groups 3H can include a first high-temperature soldering material 31H and a second high-temperature soldering material 32H, and the first high-temperature soldering material 31H and the second high-temperature soldering material 32H can be high-temperature solders or any solder materials that can be melted at a high temperature (that is to say, the first high-temperature soldering material 31H or the second high-temperature soldering material 32H can be a high temperature solder that has a high melting point). The high melting point can be an arbitrary positive (or non-positive) integer that can exceed 178° C. or 183° C. Moreover, the first high-temperature soldering material 31H and the second high-temperature soldering material 32H of each of the high-temperature soldering material groups 3H are respectively disposed on two chip pads C100 of a corresponding one of the chips C. As shown in FIG. 2, when the low-temperature soldering material groups 3L of the soldering material groups 3 are respectively disposed on the chips C of the chip-carrying structure 2, each of the first low-temperature soldering materials 31L and each of the second low-temperature soldering materials 32L are respectively disposed on a corresponding one of the first high-temperature soldering materials 31H and a corresponding one of the second high-temperature soldering materials 32H. As shown in FIG. 3, when the low-temperature soldering material groups 3L of the soldering material groups 3 are respectively disposed on the substrate pad groups 100 of the chip-detecting structure 1, the first low-temperature soldering material 31L and the second low-temperature soldering material 32L of each of the low-temperature soldering material groups 3L are respectively disposed on two substrate pads 1000 of a corresponding one of the substrate pad groups 100. However, the aforementioned description is merely an example and is not meant to limit the scope of the present disclosure.

For example, referring to FIG. 2 and FIG. 4, in the step S102 of placing the chip-carrying structure 2 and the chip-detecting structure 1 adjacent to each other, when the chip-carrying structure 2 is moved toward the chip-detecting structure 1 (or when the chip-detecting structure 1 is moved toward the chip-carrying structure 2), the soldering material groups 3 that have been respectively disposed on the chips C of the chip-carrying structure 2 in advance can respectively contact the substrate pad groups 100 of the chip-detecting structure 1. Moreover, referring to FIG. 3 and FIG. 4, in the step S102 of placing the chip-carrying structure 2 and the chip-detecting structure 1 adjacent to each other, when the chip-carrying structure 2 is moved toward the chip-detecting structure 1 (or when the chip-detecting structure 1 is moved toward the chip-carrying structure 2), the soldering material groups 3 that have been respectively disposed on the substrate pad groups 100 of the chip-detecting structure 1 in advance can respectively contact the chips C of the chip-carrying structure 2. However, the aforementioned description is merely an example and is not meant to limit the scope of the present disclosure.

For example, referring to FIG. 1 and FIG. 4, the step S104 of respectively curing the low-temperature soldering material groups 3L by heating of the micro heater groups 11 further includes: firstly, respectively melting the first low-temperature soldering material 31L and the second low-temperature soldering material 32L of each of the low-temperature soldering material groups 3L by a first micro heater 111 and a second micro heater 112 of a corresponding one of the micro heater groups 11 (the first micro heater 111 and the second micro heater 112 can be respectively heated according to the melting point of the first low-temperature soldering material 31L and the melting point of the second low-temperature soldering material 32L) (step S1042); and then respectively curing (such as cooling and then solidifying) the first low-temperature soldering material 31L and the second low-temperature soldering material 32L of each of the low-temperature soldering material groups 3L, so that a corresponding one of the chips C is electrically connected to the chip-detecting structure 1 respectively through the first low-temperature soldering material 31L and the second low-temperature soldering material 32L that have been cured (such as solidified) (step S1044). However, the aforementioned description is merely an example and is not meant to limit the scope of the present disclosure.

For example, referring to FIG. 1 and FIG. 5, the step S106 of detecting the chips C further includes: firstly, detecting each of the chips C so as to obtain an electrical property (such as including voltage, current etc.) and an optical property (such as including luminous flux, luminous intensity, spectral wavelength distribution etc.) of each of the chips C (step S1062); and then dividing each of the chips C into a good chip (C-GO) or a bad chip (C-NG) according to the electrical property or the optical property (or according to the electrical property and the optical property) of each of the chips C (step S1064). More particularly, because the chip C is electrically connected to the chip-detecting structure 1 through the first low-temperature soldering material 31L and the second low-temperature soldering material 32L that have been cured, the electrical property of the chip C can be obtained by the chip-detecting structure 1. In addition, the chip-carrying structure 2 includes a chip-carrying substrate 20 that can be made of light-transmitting material, so that the optical property of the chip C can be obtained by an optical detection module D. However, the aforementioned description is merely an example and is not meant to limit the scope of the present disclosure.

For example, referring to FIG. 1, and FIG. 5 to FIG. 7, after the step S106 of detecting the chips C so as to divide the chips C into the good chips (C-GO) and the bad chips (C-NG), the chip-detecting method further includes: for the good chips (C-GO), melting a part of the low-temperature soldering material groups 3L by heating of a part of the micro heater groups 11 so as to separate the good chips (C-GO) from the chip-detecting structure 1 (step S108). More particularly, the step of separating the good chips (C-GO) from the chip-detecting structure 1 further includes: firstly, referring to FIG. 1 and FIG. 6, for the good chip (C-GO), respectively melting the first low-temperature soldering material 31L and the second low-temperature soldering material 32L of each of the low-temperature soldering material groups 3L by a first micro heater 111 and a second micro heater 112 of a corresponding one of the micro heater groups 11 so as to decrease bonding strength between the good chip (C-GO) and the low-temperature soldering material group 3L (such as decreasing bonding strength between a chip pad C100 of the good chip (C-GO) and the first low-temperature soldering material 31L of the low-temperature soldering material group 3L, and decreasing bonding strength between another chip pad C100 of the good chip (C-GO) and the second low-temperature soldering material 32L of the low-temperature soldering material group 3L) (step S1082); and then referring to FIG. 1 and FIG. 7, only separating the good chips (C-GO) from the chip-detecting structure 1 so that the bad chips (C-NG) are remained on the chip-detecting structure 1 (step S1084). However, the aforementioned description is merely an example and is not meant to limit the scope of the present disclosure.

It should be noted that the bad chips (C-NG) can also be separated from the chip-detecting structure 1. For example, for the bad chip (C-NG), the first low-temperature soldering material 31L and the second low-temperature soldering material 32L of each of the low-temperature soldering material groups 3L can be respectively melted by a first micro heater 111 and a second micro heater 112 of a corresponding one of the micro heater groups 11 so as to decrease bonding strength between the bad chip (C-NG) and the low-temperature soldering material group 3L, and then the bad chips (C-NG) can be separated from the chip-detecting structure 1 so that the good chips (C-GO) can be remained on the chip-detecting structure 1. However, the aforementioned description is merely an example and is not meant to limit the scope of the present disclosure.

Figure 7:
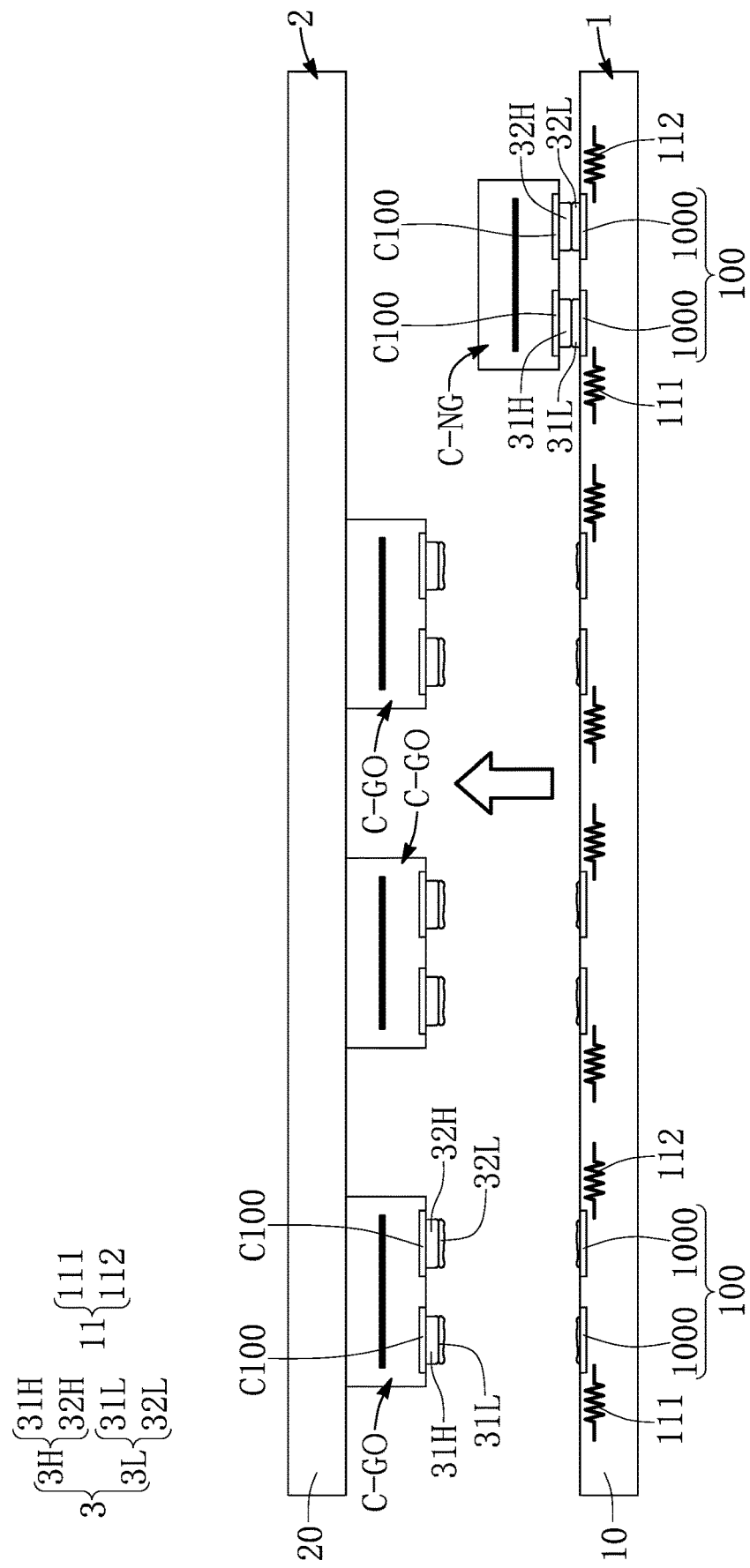
FIG. 7 is a schematic view of a plurality of good chips being separated from a chip-detecting substrate according to the present disclosure.
Figure 8:
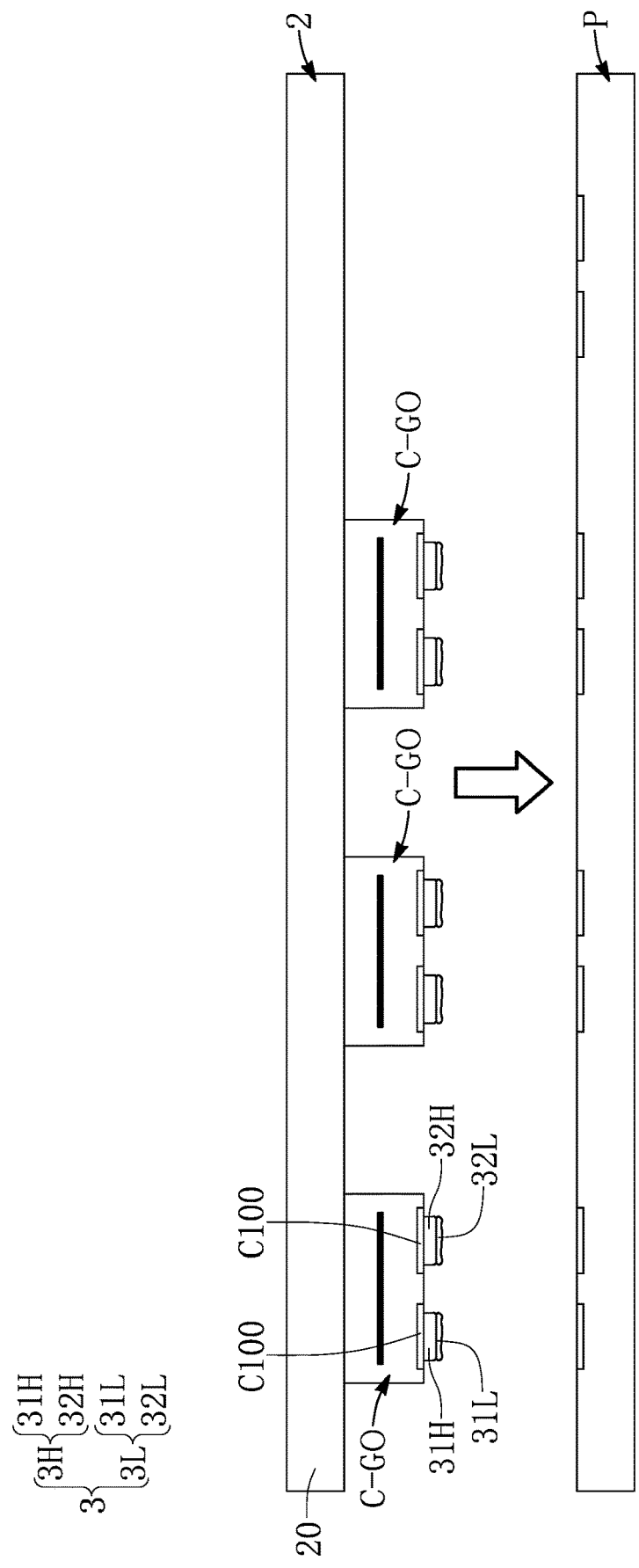
FIG. 8 is a schematic view of the good chips before being transmitted to a circuit substrate according to the present disclosure.
Figure 9:
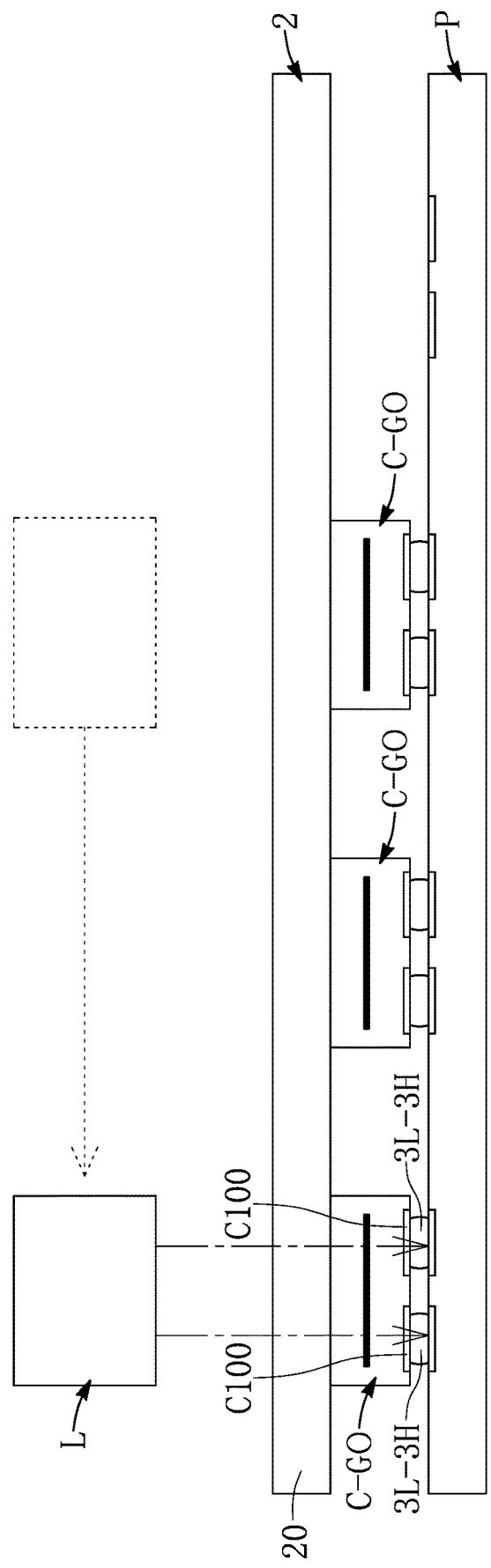
FIG. 9 is a schematic view of the good chips after being transmitted to the circuit substrate according to the present disclosure.
Figure 10:
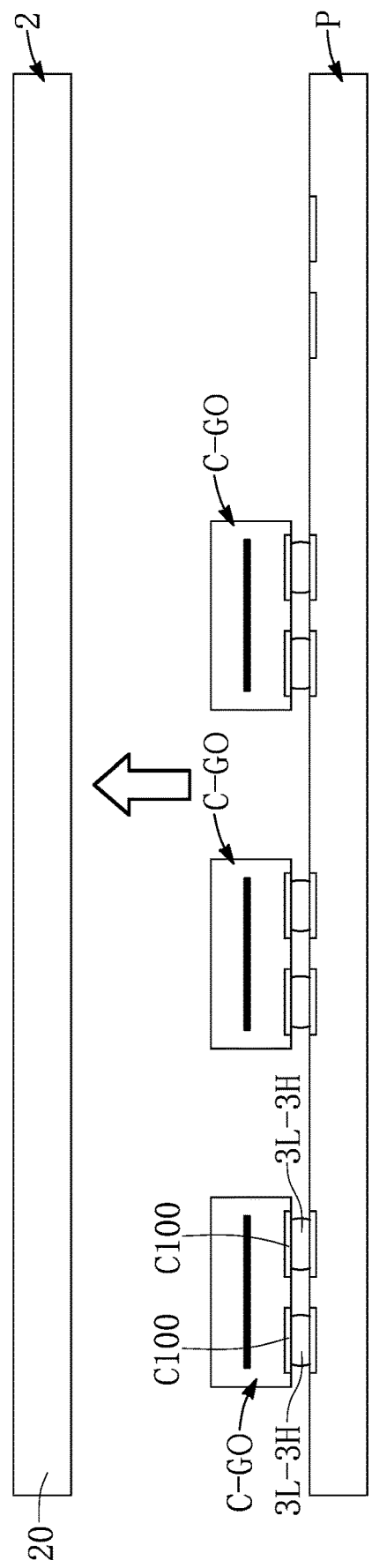
FIG. 10 is a schematic view of a chip-carrying substrate being separated from the good chips according to the present disclosure.

For example, referring to FIG. 1, and FIG. 7 to FIG. 11, after the step S108 of separating the good chips (C-GO) from the chip-detecting structure 1, the chip-detecting method further includes: firstly, referring to FIG. 1 and FIG. 7, sequentially or simultaneously separating the good chips (C-GO) from a chip-detecting substrate 10 of the chip-detecting structure 1 (the step S110(A)); and then referring to FIG. 1, and FIG. 8 to FIG. 11, sequentially or simultaneously transmitting the good chips (C-GO) to a circuit substrate P (the step S112(A)) so as to complete the step of transmitting the chips C. It should be noted that the low-temperature soldering material group 3L and the high-temperature soldering material group 3H can be melted together to form a fusion material group (3L-3H), and the good chip (C-GO) can be bonded on the circuit substrate P through the fusion material group (3L-3H). More particularly, referring to FIG. 8 and FIG. 9, in the step S112, the good chips (C-GO) can be sequentially or simultaneously disposed on the circuit substrate P (as shown in FIG. 8), and then the good chips (C-GO) can be sequentially or simultaneously fixed on the circuit substrate P by a material solidifying module L (such as the low-temperature soldering material group 3L and the high-temperature soldering material group 3H can be melted together by a laser light or an IR light so as to form the fusion material group (3L-3H) for bonding the good chips (C-GO) on the circuit substrate P) (as shown in FIG. 9). Moreover, referring to FIG. 10 and FIG. 11, when the good chips (C-GO) are adhered to the chip-carrying substrate 20 through an adhesive material (not shown), because the good chips (C-GO) are bonded on the circuit substrate P through the fusion material group (3L-3H), the good chips (C-GO) can be remained on the circuit substrate P after separating the chip-carrying substrate 20 from the good chips (C-GO). However, the aforementioned description is merely an example and is not meant to limit the scope of the present disclosure.

It should be noted that as shown in FIG. 3, the first embodiment of the present invention further provides a chip-detecting structure 1 that includes a chip-detecting substrate 10 and a plurality of micro heater groups 11. For example, the chip-detecting substrate 10 includes a plurality of substrate pad groups 100, the micro heater groups 11 are disposed on the chip-detecting substrate 10 or inside the chip-detecting substrate 10, and the substrate pad groups 100 of the chip-detecting substrate 10 are respectively used for carrying a plurality of low-temperature soldering material groups 3L. More particularly, each of the high-temperature soldering material groups 3H includes a first high-temperature soldering material 31H and a second high-temperature soldering material 32H, and each of the low-temperature soldering material groups 3L includes a first low-temperature soldering material 31L for contacting the first high-temperature soldering material 31H, and a second low-temperature soldering material 32L for contacting the second high-temperature soldering material 32H. In addition, the first low-temperature soldering material 31L and the second low-temperature soldering material 32L of each of the low-temperature soldering material groups 3L are respectively disposed on two substrate pads 1000 of a corresponding one of the substrate pad groups 100. However, the aforementioned description is merely an example and is not meant to limit the scope of the present disclosure.

It should be noted that as shown in FIG. 2, the first embodiment of the present invention further provides a chip-carrying structure 2 that includes a chip-carrying substrate 20 for carrying a plurality of chips C. For example, the chips C can be respectively used for carrying a plurality of soldering material groups 3, and each of the soldering material groups 3 includes a high-temperature soldering material group 3H disposed on a corresponding one of the chips C, and a low-temperature soldering material group 3L disposed on the high-temperature soldering material group 3H. More particularly, each of the high-temperature soldering material groups 3H includes a first high-temperature soldering material 31H and a second high-temperature soldering material 32H, and the first high-temperature soldering material 31H and the second high-temperature soldering material 32H of each of the high-temperature soldering material groups 3H are respectively disposed on two chip pads C100 of a corresponding one of the chips C. In addition, each of the low-temperature soldering material groups 3L includes a first low-temperature soldering material 31L and a second low-temperature soldering material 32L, and each of the first low-temperature soldering materials 31L and each of the second low-temperature soldering materials 32L are respectively disposed on a corresponding one of the first high-temperature soldering materials 31H and a corresponding one of the second high-temperature soldering materials 32H. However, the aforementioned description is merely an example and is not meant to limit the scope of the present disclosure.

Second Embodiment

Figure 11:
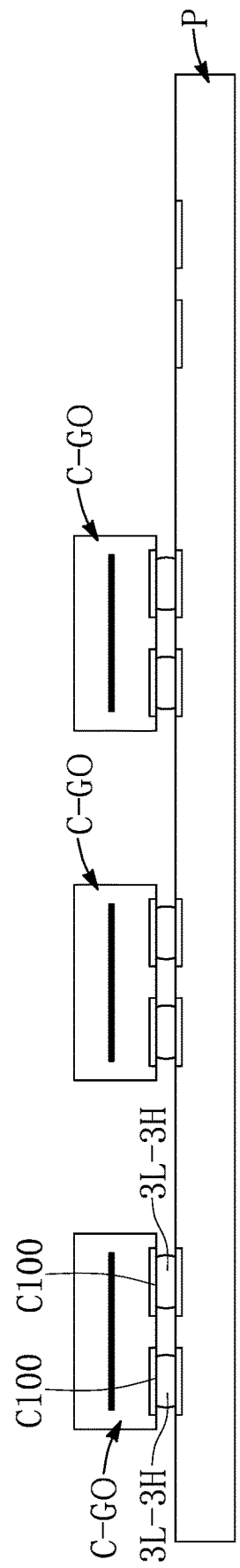
FIG. 11 is a schematic view of the good chips being bonded on the circuit substrate according to the present disclosure.
Figure 12:
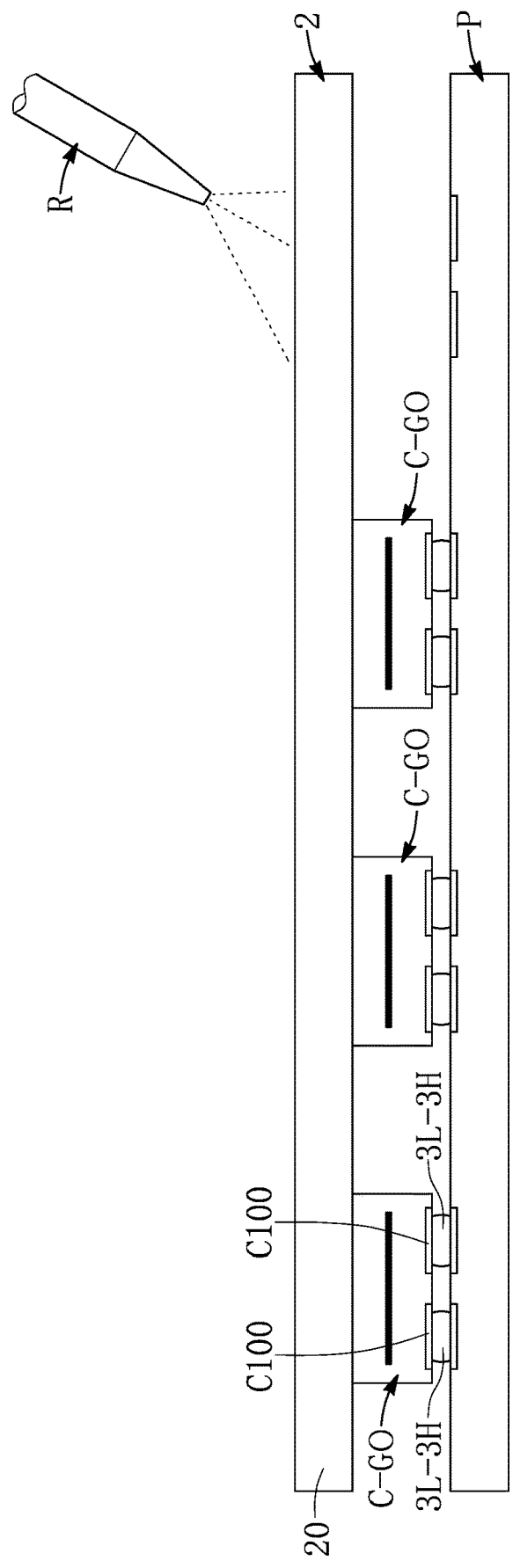
FIG. 12 is a schematic view of the chip-detecting method using a material-removing module according to the second embodiment of the present disclosure.

Referring to FIG. 1, FIG. 11 and FIG. 12, a second embodiment of the present disclosure provides a chip-detecting method. Comparing FIG. 12 with FIG. 10, the biggest difference between the second embodiment and the first embodiment is as follows: after the step S108 of separating the good chips (C-GO) from the chip-detecting structure 1, the chip-detecting method of the second embodiment further includes: firstly, referring to FIG. 1 and FIG. 12, sequentially or simultaneously transmitting the good chips (C-GO) to a circuit substrate P (step S110(B)); and then referring to FIG. 1, FIG. 11 and FIG. 12, removing a chip-carrying substrate 20 of the chip-carrying structure 2 from the good chips (C-GO) by a material-removing module R (such as a photoresist-stripping solution generating device for providing a photoresist-stripping solution that can be an organic solvent or an inorganic solvent) (step S112(B)) so as to complete the step of transmitting the chips C. It should be noted that the low-temperature soldering material group 3L and the high-temperature soldering material group 3H can be melted together to form a fusion material group (3L-3H), and the good chip (C-GO) can be bonded on the circuit substrate P through the fusion material group (3L-3H).

Beneficial Effects of the Embodiments

In conclusion, by virtue of "placing the chip-carrying structure 2 and the chip-detecting structure 1 adjacent to each other, so that each of the soldering material groups 3 simultaneously contact the chip-carrying structure 2 and the chip-detecting structure 1, each of the soldering material groups 3 including a low-temperature soldering material group 3L and a high-temperature soldering material group 3H that has a melting point higher than a melting point of the low-temperature soldering material group 3L", "respectively curing the low-temperature soldering material groups 3L by heating of the micro heater groups 11, so that the chips C are electrically connected to the chip-detecting structure 1 respectively through the low-temperature soldering material groups 3L that have been cured" and "detecting the chips C so as to divide the chips C into a plurality of good chips (C-GO) and a plurality of bad chips (C-NG)", before the chips C are bonded on a circuit substrate P, the good chips (C-GO) can be selected from the chips C in advance by detecting of the chip-detecting structure 1 so as to ensure that only the good chips (C-GO) can be bonded on the circuit substrate P during a chip-bonding process.

Moreover, by virtue of "the chip-detecting substrate 10 including a plurality of substrate pad groups 100", "the micro heater groups 11 being disposed on the chip-detecting substrate 10 or inside the chip-detecting substrate 10" and "the substrate pad groups 100 of the chip-detecting substrate 10 being respectively used for carrying a plurality of low-temperature soldering material groups 3L", each of the chips C can be electrically connected to the chip-detecting substrate 10 through the low-temperature soldering material group 3L. Whereby, before the chips C are bonded on a circuit substrate P, the good chips (C-GO) can be selected from the chips C in advance by detecting of the chip-detecting structure 1 so as to ensure that only the good chips (C-GO) can be bonded on the circuit substrate P during a chip-bonding process.

Furthermore, by virtue of "the chip-carrying substrate 20 being used for carrying a plurality of chips C" and "each of the soldering material groups 3 including a high-temperature soldering material group 3H disposed on a corresponding one of the chips C, and a low-temperature soldering material group 3L disposed on the high-temperature soldering material group 3H", each of the chips C can be electrically connected to the chip-detecting substrate 10 through the low-temperature soldering material group 3L. Whereby, before the chips C are bonded on a circuit substrate P, the good chips (C-GO) can be selected from the chips C in advance by detecting of the chip-detecting structure 1 so as to ensure that only the good chips (C-GO) can be bonded on the circuit substrate P during a chip-bonding process.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip-detecting method, comprising:
    providing a chip-detecting structure, a chip-carrying structure, and a plurality of soldering material groups, wherein the chip-detecting structure includes a plurality of micro heater groups, the chip-carrying structure is used for carrying a plurality of chips, and the soldering material groups are disposed between the chip-carrying structure and the chip-detecting structure;
    placing the chip-carrying structure and the chip-detecting structure adjacent to each other, so that each of the soldering material groups simultaneously contact the chip-carrying structure and the chip-detecting structure, wherein each of the soldering material groups includes a low-temperature soldering material group and a high-temperature soldering material group that has a melting point higher than a melting point of the low-temperature soldering material group;
    respectively curing the low-temperature soldering material groups by heating of the micro heater groups, so that the chips are electrically connected to the chip-detecting structure respectively through the low-temperature soldering material groups that have been cured; and
    detecting the chips so as to divide the chips into a plurality of good chips and a plurality of bad chips.

2. The chip-detecting method according to claim 1, wherein, in the step of providing the chip-detecting structure, the chip-carrying structure, and the soldering material groups, the chip-detecting structure and the chip-carrying structure are separated from each other, and the low-temperature soldering material groups of the soldering material groups are respectively disposed on the chips of the chip-carrying structure or a plurality of substrate pad groups of the chip-detecting structure.

3. The chip-detecting method according to claim 2, wherein each of the low-temperature soldering material groups includes a first low-temperature soldering material and a second low-temperature soldering material, each of the high-temperature soldering material groups includes a first high-temperature soldering material and a second high-temperature soldering material, and the first high-temperature soldering material and the second high-temperature soldering material of each of the high-temperature soldering material groups are respectively disposed on two chip pads of a corresponding one of the chips.

4. The chip-detecting method according to claim 3, wherein each of the first low-temperature soldering materials and each of the second low-temperature soldering materials are respectively disposed on a corresponding one of the first high-temperature soldering materials and a corresponding one of the second high-temperature soldering materials.

5. The chip-detecting method according to claim 3, wherein the first low-temperature soldering material and the second low-temperature soldering material of each of the low-temperature soldering material groups are respectively disposed on two substrate pads of a corresponding one of the substrate pad groups.

6. The chip-detecting method according to claim 2, wherein, in the step of placing the chip-carrying structure and the chip-detecting structure adjacent to each other, the soldering material groups that have been respectively disposed on the chips of the chip-carrying structure in advance respectively contact the substrate pad groups of the chip-detecting structure.

7. The chip-detecting method according to claim 2, wherein, in the step of placing the chip-carrying structure and the chip-detecting structure adjacent to each other, the soldering material groups that have been respectively disposed on the substrate pad groups of the chip-detecting structure in advance respectively contact the chips of the chip-carrying structure.

8. The chip-detecting method according to claim 2, wherein the step of respectively curing the low-temperature soldering material groups by heating of the micro heater groups further includes:
respectively melting the first low-temperature soldering material and the second low-temperature soldering material of each of the low-temperature soldering material groups by a first micro heater and a second micro heater of a corresponding one of the micro heater groups; and
respectively curing the first low-temperature soldering material and the second low-temperature soldering material of each of the low-temperature soldering material groups, so that a corresponding one of the chips is electrically connected to the chip-detecting structure respectively through the first low-temperature soldering material and the second low-temperature soldering material that have been cured.

9. The chip-detecting method according to claim 2, wherein, after the step of detecting the chips so as to divide the chips into the good chips and the bad chips, the chip-detecting method further comprises melting a part of the low-temperature soldering material groups by heating of a part of the micro heater groups so as to separate the good chips from the chip-detecting structure.

10. The chip-detecting method according to claim 9, wherein the step of separating the good chips from the chip-detecting structure further comprises:
respectively melting the first low-temperature soldering material and the second low-temperature soldering material of each of the low-temperature soldering material groups by a first micro heater and a second micro heater of a corresponding one of the micro heater groups so as to decrease bonding strength between the good chip and the low-temperature soldering material group; and
only separating the good chips from the chip-detecting structure so that the bad chips are remained on the chip-detecting structure.

11. The chip-detecting method according to claim 9, wherein, after the step of separating the good chips from the chip-detecting structure, the chip-detecting method further comprises:
separating the good chips from a chip-detecting substrate of the chip-detecting structure; and
transmitting the good chips to a circuit substrate;
wherein the low-temperature soldering material group and the high-temperature soldering material group are melted to form a fusion material group, and the good chips are bonded on the circuit substrate through the fusion material group.

12. The chip-detecting method according to claim 9, wherein, after the step of separating the good chips from the chip-detecting structure, the chip-detecting method further comprises:
transmitting the good chips to a circuit substrate; and
removing a chip-carrying substrate of the chip-carrying structure from the good chips;
wherein the low-temperature soldering material group and the high-temperature soldering material group are melted to form a fusion material group, and the good chips are bonded on the circuit substrate through the fusion material group.

13. The chip-detecting method according to claim 1, wherein the step of detecting the chips further comprises:
detecting each of the chips so as to obtain an electrical property and an optical property of each of the chips; and
dividing each of the chips into the good chip or the bad chip according to the electrical property or the optical property of each of the chips.

* * * * *